United States Patent [19]

MacMaster et al.

[11] Patent Number: 4,928,070

[45] Date of Patent: May 22, 1990

[54] LOW-NOISE CROSSED-FIELD AMPLIFIER

[75] Inventors: George H. MacMaster, Lexington; Lawrence J. Nichols, Burlington, both of Mass.

[73] Assignee: Raytheon Company, Lexington, Mass.

[21] Appl. No.: 317,098

[22] Filed: Feb. 28, 1989

Related U.S. Application Data

[63] Continuation of Ser. No. 241,798, Sep. 6, 1988, abandoned, which is a continuation of Ser. No. 143,206, Jan. 11, 1988, abandoned, which is a continuation of Ser. No. 71,534, Jul. 8, 1987, abandoned, which is a continuation of Ser. No. 946,260, Dec. 24, 1986, abandoned.

[51] Int. Cl.[5] .......................... H03F 3/58; H01J 25/34
[52] U.S. Cl. ...................................... 330/43; 315/39.3
[58] Field of Search .......................... 330/4.3; 315/39.3

[56] References Cited

U.S. PATENT DOCUMENTS 4,413,208 11/1983 Morizot ................................ 330/43

*Primary Examiner*—Gene Wan
*Attorney, Agent, or Firm*—Martin M. Santa; Richard M. Sharkansky

[57] ABSTRACT

A crossed-field amplifier circuit of the type using a CFA tube with a slow-wave structure for the anode and the cathode, each with an input and an output terminal, and a magnetic field in the axial direction, and signals of the same frequency from a common source and of controlled phase difference and amplitude applied to the input terminals of the anode and cathode slow-wave structures whose fringing fields interact with the electron cloud between the anode and the cathode to form well defined cloud fingers which result in amplification of the input signals to provide at the output terminal of the anode an amplified signal having lower random noise than hitherto available from CFA amplifiers.

56 Claims, 4 Drawing Sheets

LOW-NOISE CROSSED-FIELD AMPLIFIER

This application is a continuation of Ser. No. 241,798, filed 9-6-88, which is a continuation of Ser. No. 143,206, filed 1-11-88, which is a continuation of Ser. No. 071,534, filed 7-8-87, which is a continuation of Ser. No. 946,260, filed 12-24-86 all of which are now abandoned.

BACKGROUND OF THE INVENTION

This invention relates to crossed-field amplifiers in which the signal to be amplified is provided to the slow-wave structure of the crossed-field amplifier and the amplified signal is obtained by coupling to the slow-wave structure after amplification of the RF field in the interaction space has occurred.

The conventional prior art crossed-field amplifier 10 of FIG. 1 is an efficient high power broadband power amplifier. The gain is low so that relatively high drive power from frequency source 16 is necessary to achieve stable input/output lock operation. In the conventional crossed-field amplifier 10, the RF drive signal is introduced at the input 12 of the anode slow-wave structure 11 and the RF output power is collected in load 14 at the output 13 of the anode as schematically shown in FIG. 1. In this amplifier, a cathode 15 is a smooth cylinder on which a secondary emitter material has been placed at least in the region of the cathode radially opposite to the circumferential extent of the slow-wave structure of the anode. In the conventional crossed-field amplifier 10, the electron cloud at the cathode does not have a strong frequency determining component because of the weak incident drive signal at the cathode 15 provided by the field originating at the anode slow-wave structure 11. The conventional tube, therefore, produces noise which is typically at a level of −50 db per MHz below the level of the output signal in the load 14.

In order to reduce the input drive signal power level, the prior art cathode driven crossed-field amplifier tube 27 of FIG. 2 was developed. The tube 27 is shown schematically as having a cathode slow-wave structure 21 and an anode slow-wave structure 22. The cathode slow-wave structure was built as an integral part of the cathode and had matching dispersion characteristics with the slow-wave structure 22 of the anode. The input signal is applied by the frequency drive source 23 to one end of the cathode slow-wave structure 21 which was terminated at its other end in a matched termination 24. The anode slow-wave structure 22 was terminated at one end in a matched termination 25 and at its other end was connected to a load 26 which preferably was also a matched load. With the tube 27 schematically shown in FIG. 2, comparable power outputs to that of the tube of FIG. 1 were achievable with an order of magnitude weaker drive signal. However, the cathode driven crossed-field amplifier of FIG. 2 produced noise which was comparable with the crossed-field amplifiers of FIG. 1; namely, a signal-to-noise ratio in the order of 50 db per megahertz.

SUMMARY OF THE INVENTION

It is therefore a primary object of this invention to provide a circuit using a crossed-field amplifier tube to provide high gain together with a higher signal-to-noise ratio than has been attainable by prior art crossed-field amplifier tubes. This and other objects are obtained by providing the input signal to both the cathode slow-wave structure and the anode slow-wave structure with control of the relative phase and amplitude of each signal applied to the slow-wave structures of the anode and cathode, and terminating the output of the cathode slow-wave structure in matched terminations and the output of the anode slow-wave structure in a matched load. This new operating procedure and circuit has resulted in crossed-field amplifiers with high signal-to-noise ratios which are greater than 70 db/MHz, an improvement over the prior art crossed-field amplifier of at least 20 db/MHz.

BRIEF DESCRIPTION OF THE DRAWINGS

The aforementioned aspects and other features of the present invention will be apparent from the following description taken in conjunction with the accompanying drawings wherein.

DESCRIPTION OF THE PREFERRED EMBODIMENT

Figure 3:
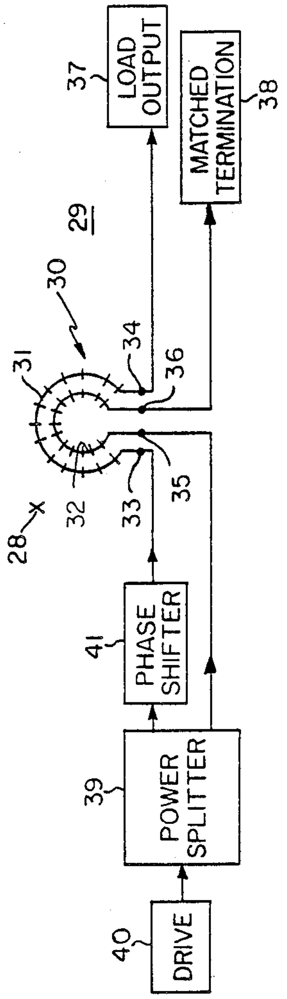
FIG. 3 is a schematic block diagram of the crossed-field amplifier circuit of this invention.

Referring now to FIG. 3, there is seen a circuit 29 schematic including a crossed-field amplifier tube 30 having a slow-wave anode structure 31 and a slow-wave cathode structure 32. The anode slow-wave structure has an input terminal and an output terminal 33, 34, respectively; and the cathode slow-wave structure has an input and output terminal 35, 36, respectively. The output terminals 34, 36 of the anode and cathode slow-wave structures 31, 32, respectively, are connected to their respective output load 37 and matched termination 38. The output load is preferably also a matched load. The input terminals 33, 35 of the anode and cathode slow-wave structures 31, 32, respectively, are connected through a power splitter 39 to a pulsed frequency drive source 40. A phase shifter 41 between the power splitter 39 and the input terminal 33 of the anode slow-wave structure allows the relative phase shift applied to the anode and cathode slow-wave structures to be adjusted to a phase angle difference which results in minimum noise output, or the maximization of gain with an acceptable signal-to-noise ratio, as desired.

As is known in the art, the use of slow-wave structures which are terminated in loads which match the characteristic impedance of the slow-wave structures prevents the formation of standing waves. Undesired coupling between the inner and outer slow-wave structures is increased by the formation of standing waves. Direct coupling between the inner and outer slow-wave structures 32, 31, respectively, is not desired in order to obtain the greatest gain without the generation of oscillation.

Figure 4:
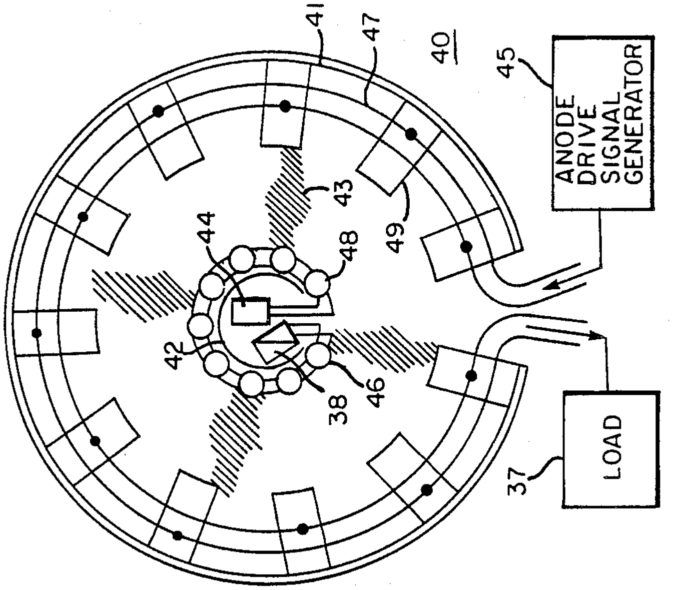
FIGS. 4 and 5 are cross-sectional views taken transversely to the longitudinal axis of the invention and prior art crossed-field amplifier tubes, respectively.

The anode slow-wave structure 31 and the cathode slow-wave structure 32 are cylindrical in form and are concentrically positioned about the longitudinal axis of the amplifier tube 30. The structures 31, 32 are also located at the same position relative to the longitudinal axis. Each of the slow-wave structures 31, 32 in one preferred embodiment is constructed in the form of a meander line, known to those skilled in the art, which is spaced from a ground plane which, in the case of the anode slow-wave structure, would be the inner surface of the cylindrical housing 41 as shown in FIG. 4. The cathode slow-wave structure 32 of FIG. 4 has a cylindrical planar structure 42 which acts as the ground plane for the slow-wave circuit 32. The meander lines 31, 32 in conjunction with the ground planes 41, 42 result in slow-wave structures which propagate a slow-wave in the fundamental forward mode. Both structures have a generally cylindrical shape and are located in the gap of a magnet (not shown) which provides a longitudinally directed magnetic field 28. The inner slow-wave structure 32 has an electron emitting surface on the surface of the meander line nearest the anode and acts as the cathode. The outer slow-wave structure 31, meander line and connected ground plane formed by housing 41 is the anode of the amplifier. The slow-wave structures are arranged to circumferentially propagate electromagnetic energy in proportion to the radii of the anode and cathode slow-wave structures so that the circumferential angular velocity of the wavefront produced by the anode slow-wave structure is equal to the circumferential angular velocity of the wavefront produced by the cathode slow-wave structure. The cathode slow-wave structure 32 has input and output terminals 35, 36, respectively. Microwave transition structures are fabricated between the input and output terminals 35, 36, respectively, and the cathode slow-wave structure to minimize any impedance mismatch. Similarly, the input and output terminals 33, 34, respectively, of the anode slow-wave structure 31 have transition microwave structures therebetween to minimize any impedance mismatch between the terminals and the slow-wave structure. The anode output terminal 34 couples the output signal from the amplifier tube 30 to a load 37 having an impedance matched to the characteristic impedance of the anode slow-wave structure.

Figure 5:
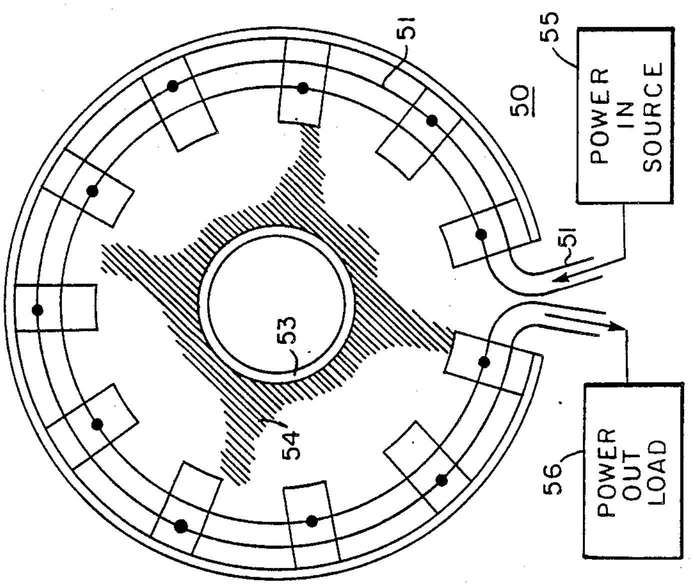
FIG. 5 PRIOR ART

FIG. 5 shows a cross-sectional view taken transversely to the longitudinal axis of a prior art crossed-field amplifier. In this amplifier tube 50, power is applied by source 55 to an input terminal 51 of the anode slow-wave structure 52. The other end of the anode slow-wave structure is provided with an output from which power out to load 56 is obtained. The cathode 53 is conventionally made of a secondary electron emission material which provides an electron cloud 54 in the interaction space between the anode slow-wave structure 52 and the cathode 53. The electromagnetic wave produced by the radio frequency power applied to the anode slow-wave structure 52 causes the electrons of the electron cloud to have a spoke-like configuration in the region nearest the anode slow-wave structure 52. The region in the immediate vicinity of the cathode 53 does not have the spoke-like configuration and is substantially a cloud of electrons of substantially uniform concentration which are undergoing epicycloidal paths of motion causing some electrons to return to the cathode 53 to provide the secondary emission from which additional electrons are produced. These epicycloidal electrons are random in motion and generate their individual electromagnetic fields which are coupled to the anode slow-wave structure 52 to thereby produce a high noise level in the power spectrum of the output power from the crossed-field amplifier tube 50. The result of the electron cloud noise generation is that the signal-to-noise ratio of the prior art crossed-field amplifier tube was only approximately 50 db signal-to-noise per MHz. FIG. 5 shows a cathode with no slow-wave structure, but the electron space charge (electron cloud) 54 is essentially unaltered even when the cathode is in the form of a slow-wave structure and the tube is operated in the prior art amplifier circuit of FIG. 2.

Referring now to FIG. 4, there is shown an axial cross-sectional schematic representation of the crossed-field amplifier tube 30 when used in the circuit 29 of FIG. 3 of this invention wherein the electrons emitted from the cathode slow-wave structure 32 are shown to be in the form of well-defined spokes 43 which is believed to be responsible for the improvement in the signal-to-noise ratio of the amplified output signal appearing in the load 37. The well-formed spokes of electrons 43 are produced by the application of the microwave signal to the cathode slow-wave structure 32 provided by the cathode drive signal source 44 and by the application of the microwave signal to the anode slow-wave structure 47 by the anode drive signal source 45. Source 44 corresponds to the frequency drive source 40, the power splitter 39 and the phase shifter 41 of FIG. 3. The anode drive signal source 45 is comprised of the frequency drive source 40 and power splitter 39 of FIG. 3. It should be noted that in FIG. 4 the cathode slow-wave structure 46 and the anode slow-wave structure 47 are schematically represented by vanes 48, 49, respectively, which are strapped in a manner known to those skilled in the art to produce a slow-wave structure of the backward wave type. It should be noted that the slow-wave structures of the cathode and the anode should be of the same type for ease in matching phase dispersion characteristics of the structures; namely, either strapped vanes as in FIG. 4, or meander lines such as that described in conjunction with FIG. 3 which was a forward wave type tube, or helix stub-supported lines; all well known to those skilled in the art as typical slow-wave structures. The invention may be utilized with either backward or forward wave tube types. A typical high gain S-band type crossed-field amplifier tube of the backward wave type has the Raytheon Company designation QKS2016 and has been successfully utilized in this invention. Both the meander line slow-wave structures and the strapped bar vane type of slow-wave structure are well known to those skilled in the art. In both instances, the cathode slow-wave structure has the face nearest the interaction region of the tube of the vanes, or the spaced bar of a meander line, or the helix coated with a primary emitter or a secondary electron emissive substance which typically are Au/MgO, platinum, $BeO_2$, a cermet such as thoriated tungsten, or tungsten impregnated with barium aluminate. As known to those skilled in the art, certain of these emitters may require a filament to heat the cathode emissive surface to either initiate or sustain sufficient electron emission for tube operation. The meander line slow-wave structure for both the cathode and the anode is comprised of connected alternate ends of adjacently spaced successive longitudinal bars by shorting bars. In the case of strapped vane type slow-wave structures, the structures are formed by the vanes terminated at one end by a surface of the cylindrical electrically conductive wall 42, 41 for the cathode and anode slow-wave structures, respectively. The helix form of slow-wave structures for the anode and cathode are stub supported in the conventional manner.

Figure 1:
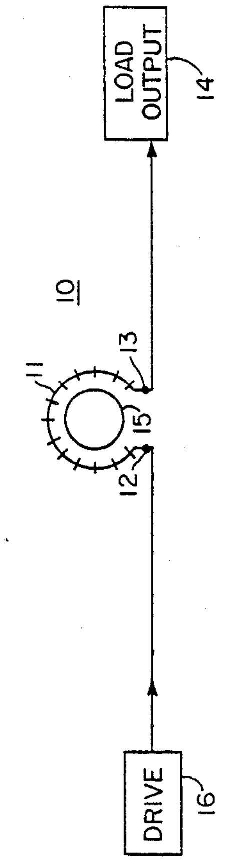
FIG. 1 PRIOR ART
FIGS. 1 and 2 are schematic block diagrams of prior art crossed-field amplifier circuits.
Figure 2:
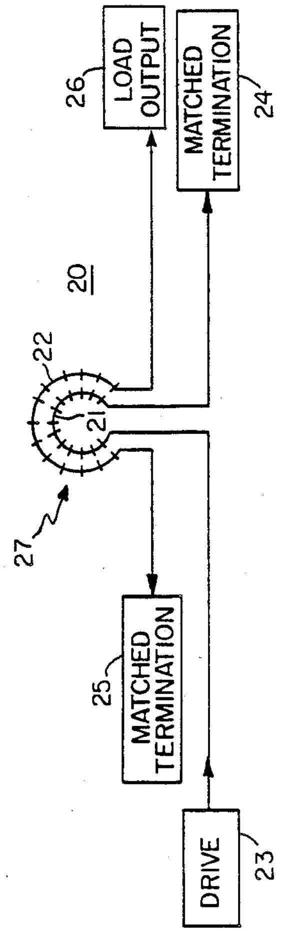
FIG. 2 PRIOR ART
Figure 6:
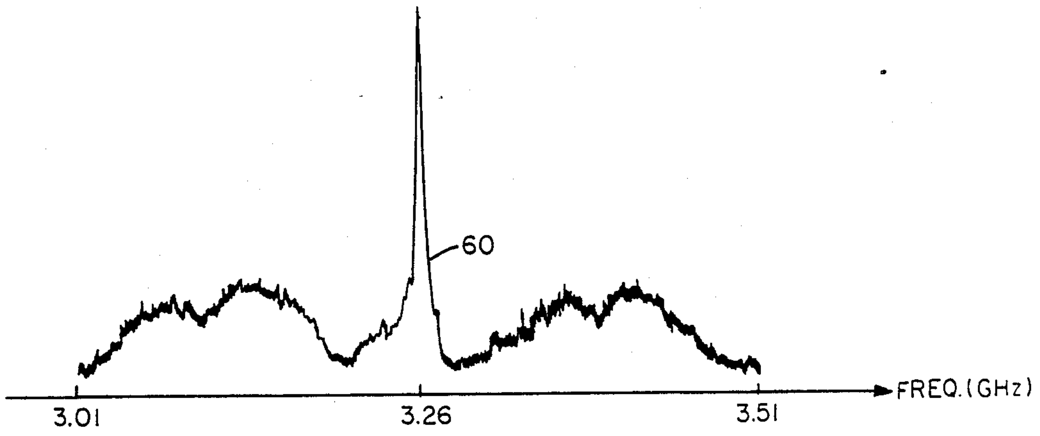
FIG. 6 shows the output spectrum of a pulsed crossed-field amplifier circuit of the prior art shown in FIG. 2.

FIG. 6 shows the output spectra 60 of a pulsed cathode driven crossed-field amplifier QKS 2016 operated as in the prior art circuit of FIG. 2. The spectrum shown covers the frequency range 3 to 3.5 GHz with the amplified center frequency at 3.26 GHz. The measured signal-to-noise ratio was 50 db per MHz.

Figure 7:
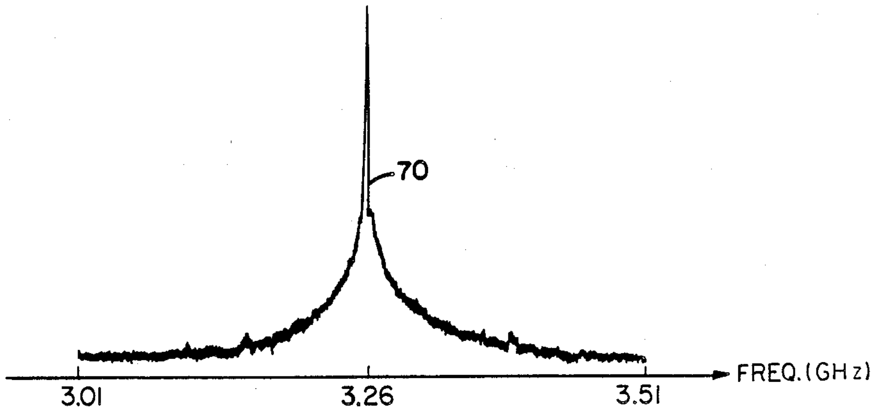
FIG. 7 shows the output spectrum of a pulsed crossed-field amplifier circuit of this invention shown in FIG. 3.

Referring now to FIG. 7, there is shown the output spectrum 70 obtained when the circuit of this invention is used in conjunction with a pulsed crossed-field amplifier of the QKS 2016 type under essentially the same conditions which resulted in the spectrum of FIG. 6. The spectrum covers the same frequency range as the spectrum of FIG. 6 for the amplified signal centered at 3.26 Ghz. The signal-to-noise ratio obtained with the same crossed-field QKS 2016 amplifier tube as that used in providing the frequency spectra of FIG. 6 is an improved signal-to-noise ratio of 70 db per MHz. This signal-to-noise ratio has been obtained at current levels as low as 20 amperes and as high as 56 amperes. The measurements have been made with drive levels of 10 to 30 kilowatts, and voltage levels of 15 to 32 kilovolts, and at magnetic fields of 2000 to 2800 gauss. The signal-to-noise measurements were made using an RF spectrum analyzer to measure the noise at a frequency outside the pulse spectrum. This measurement responds only to additive amplifier noise. A cathode driven CFA is a broadband amplifier, so its noise density is the same inside and outside the pulse spectrum. Measurements of the noise level between the pulse spectral line indicates a signal-to-noise ratio of at least 64 db per MHz. In the design of a low-noise backward wave CFA, a major consideration is providing the proper RF field concentration in the drift region to keep the electron spokes from spreading and going from input to output through the drift region. To achieve this field configuration, a rotation of the cathode circuit toward the anode circuit output is a preferred construction.

Figure 8:
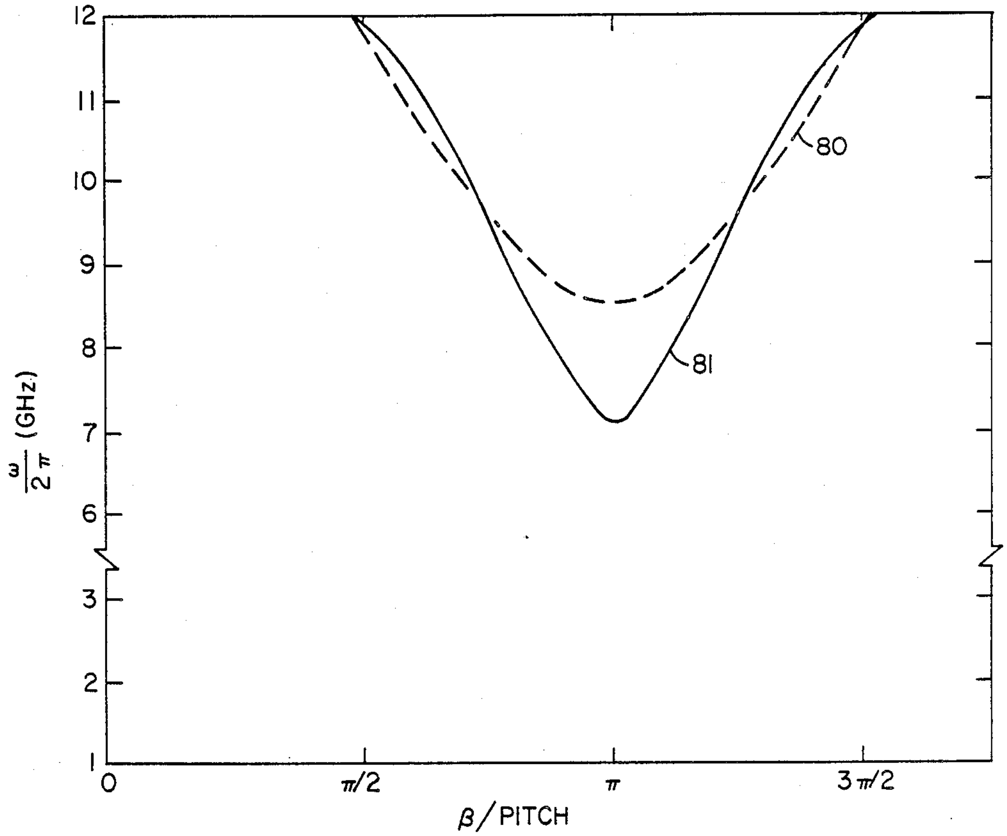
FIG. 8 is the $\omega$-$\beta$ diagram for a cathode and anode circuit of a tube having vane-type slow-wave circuits.

A typical cathode slow-wave circuit design consists of 40 vanes with the same number of vanes being used in the anode slow-wave structure. The object of this design is to produce a cathode slow-wave circuit with a vane-to-vane dispersion very nearly identical to that of the anode circuit in the region from 9.5 GHz (137.8°/pitch) to 10 GHz (127.5°/pitch). Matching of the anode and cathode dispersion is required for wide bandwidth operation. The circuit phase velocity ($\omega/\beta$) is proportional to the ratio of the operating frequency $\omega/2\pi$ to the circuit phase shift per pitch ($\beta$/pitch). On the $\omega$-$\beta$ diagram for the slow-wave circuit, the phase velocity is proportional to the slope of a line drawn from the origin to the point of operation on the circuit dispersion characteristic curve. The $\omega$-$\beta$ diagram for the 40-vane cathode and anode circuit is shown in FIG. 8 where the circuit phase shift $\beta$ per pitch 80, 81 for the anode and cathode slow-wave circuits, respectively, are shown to extend from 0 to $\pi$ radians for the network fundamental wave. The $\omega$-$\beta$ diagram for the anode circuit was measured by cold test procedures on a completed anode slow-wave structure. The dispersion curve 81 for the cathode slow-wave circuit was calculated. The $\omega$-$\beta$ diagrams 80, 81 show that similar dispersion characteristics have been attained for the cathode and circuit designs. In order to match the dispersion and circuit characteristics of the anode and cathode slow-wave circuits, the cathode vane length was required to be longer than the length of the anode vanes. The cathode vanes are 0.815" long while the anode vanes are 0.600" long. This difference in length is undesirable because it increases the separation between the magnetic pole pieces which could add to the weight of the magnets.

Figure 9:
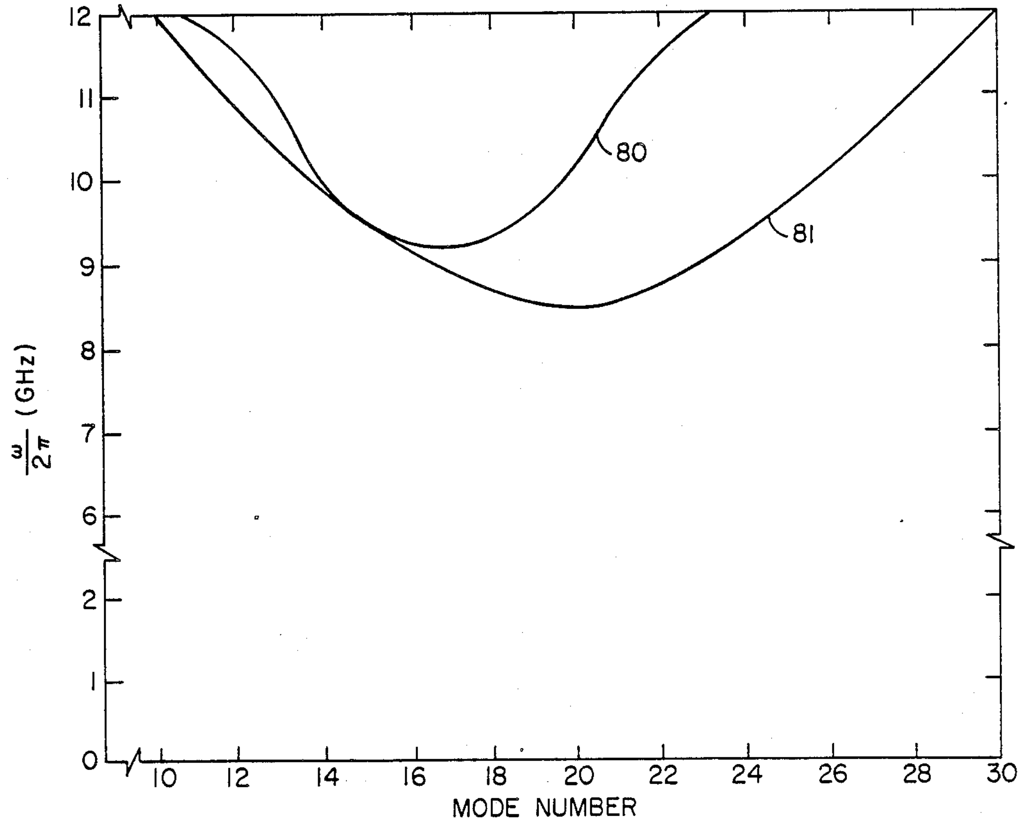
FIG. 9 is a plot of frequency as a function of the mode number of the anode and cathode slow-wave circuits.

To reduce the length of the cathode vanes, a second network was analyzed in which 34 vanes are used in the cathode slow-wave circuit. The phase velocity of the RF wave on the 34-vane cathode circuit was made equal to the phase velocity of the RF wave on the 40-vane anode circuit. The cathode vane length is 0.626" while the anode vane length is 0.600". When the cathode and anode circuits had the same pitch, the conditions for synchronism for the phase velocity of the RF waves were described by the $\omega$-$\beta$ diagram of FIG. 8. It is more convenient when each network has different pitches to change the horizontal axis to the total phase shift around the circuit rather than to use the phase shift per section. The horizontal axis of FIG. 9 is characterized in terms of mode number or the number of wavelengths around the circuit. The synchronism condition between the RF wave on the cathode and the anode circuit can be portrayed on the mode chart of FIG. 9.

Phase velocity of the RF waves is represented on the mode chart as the slope of a straight line from a point on the circuit curve to the origin. For the 34-vane cathode circuit and the 40-vane anode circuit wavelengths/frequency curves 90, 91, respectively, shown in FIG. 9, the phase velocity of the RF waves on the anode and the cathode circuits, respectively, are equal from 9.5 gigahertz (mode number=15.3) to 10 gigahertz (mode number=14.2), which is the operating band of the amplifier tube. The curve 91 for the anode circuit is measured data while the cathode curve 90 is from calculated data.

Although the invention has been described in terms of preferred embodiments having concentric cylindrical anode and cathode slow-wave structures (circuits), the linear (non-cylindrical) form of spaced anode and cathode slow-wave circuits is expected to have advantages over the cylindrical form. A particular embodiment of linear form of slow-wave circuits would be one in which the anode and cathode lie along parallel spaced planes. In summary, the invention may be advantageously utilized with any crossed-field amplifier tube having forward or backward anode and cathode slow-wave circuits of any configuration.

Although the invention has been described in a preferred embodiment as having a pulsed frequency source 40, which resulted in the spectra of FIGS. 6 and 7, it should be understood that this invention may be used with a continuously applied source with due consideration for the power dissipation characteristics of the tube and other components of FIG. 3.

Also, although spectra have been shown for operation of a particular tube type, the OKS 2016, in the S-band range of frequencies, pulsed operation of a different tube type has been obtained in the X-band range with comparable improvement of the signal-to-noise ratio of the output signal. Operation of the invention with suitable tube types in the tens of GHz frequency band is also expected to result in improvement in the signal-to-noise ratio of the amplified output signal compared to the prior art.

Having described a preferred embodiment of the invention, it will be apparent to one of skill in the art that other embodiments incorporating its concept may be used. It is believed, therefore, that this invention should not be restricted to the disclosed embodiment but rather should be limited only by the spirit and scope of the appended claims.

What is claimed is:

1. A low-noise crossed-field amplifier tube circuit for use with a frequency source providing an input signal to said tube circuit comprising:

a tube comprising an anode comprising a first slow-wave circuit having a first input and a first output;

a cathode;

an interaction space between said anode and cathode;

said cathode comprising a second slow-wave circuit having a second input and a second output, said cathode providing electrons to the interaction space between said cathode and said anode;

means providing a first portion of an input signal to the input of said first slow-wave circuit and providing a portion of said input signal to the input of said second slow-wave circuit;

means controlling the relative phase of said first portion with respect to said second portion of said input signal;

the output of said first slow-wave circuit being adapted to be connected to an output load; and the output of said second slow-wave circuit being adapted to be connected to a termination.

2. The low-noise amplifier circuit of claim 1 wherein:

said means for providing a first portion and said means for providing a second portion of said signal comprises a power divider.

3. The low-noise amplifier circuit of claim 1 wherein:

said means for controlling the relative phase comprises a phase shifter connected between said power splitter and one of said inputs.

4. The circuit of claim 3 wherein:

said one of said inputs is the input of said anode slow-wave circuit.

5. The circuit of claim 1 comprising in addition:

an output load connected to and having an impedance matched to the impedance of said first slow-wave circuit.

6. The circuit of claim 1 wherein:

a termination connected to and having an impedance matched to the impedance of said second slow-wave circuit.

7. The circuit of claim 1 wherein:

said means for providing a first portion and means for providing a second portion comprises means for controlling the relative amplitude of said first portion and said second portion of said input signal.

8. The amplifier circuit of claim 1 wherein:

said first and second slow-wave circuits have phase dispersion characteristics which are substantially matched at at least an operating frequency of said tube.

9. The amplifier circuit of claim 6 wherein:

said phase dispersion characteristics are substantially matched over a band of frequencies.

10. The amplifier circuit of claim 1 wherein:

said first and second slow-wave circuits have substantially the same phase shift per pitch over the operating frequency range of said amplifier circuit.

11. The amplifier circuit of claim 1 wherein:

said first and second slow-wave circuits have substantially the same mode number over the operating frequency band of the crossed-field amplifier tube circuit.

12. The amplifier circuit of claim 1 wherein:

the total phase shift from input to output terminal of each of said first and second slow-wave circuits, respectively, is substantially the same at at least one frequency in the operating band of said tube.

13. The tube of claim 1 wherein said termination is an impedance matched to the output impedance of said second slow-wave circuit.

14. The tube of claim 1 wherein said cathode slow-wave circuit comprises spaced electron emissive surfaces each forming individual spaced cathodes.

15. The tube of claim 1 wherein said cathode slow-wave circuit comprises spaced bars, said bars having an electron emissive substance coating forming a cathode on each said coated bar.

16. The tube of claim 15 wherein said bars are circumferentially spaced and longitudinally extending.

17. A low-noise crossed-field amplifier tube circuit comprising:

a tube comprising an anode comprising a first slow-wave circuit having a first input terminal and a first output terminal;

a cathode;

an interaction space between said anode and cathode;

said cathode comprising a second slow-wave circuit having a second input terminal and a second output terminal, said cathode providing electrons to the interaction space between said cathode and said anode;

a frequency source providing an input signal;

means for providing a first portion of said input signal to the input terminal of said first slow-wave circuit and for providing a portion of said input signal to the input terminal of said second slow-wave circuit;

means for controlling the relative phase of said first portion with respect to said second portion of said input signal;

an output load connected to the output terminal of said first slow-wave circuit; and a termination connected to the output terminal of said second slow-wave circuit.

18. The low-noise amplifier circuit of claim 17, wherein:

said means for providing a first portion and said means for providing a second portion of said input signal comprises a power divider.

19. The low-noise amplifier circuit of claim 18 wherein:

said means for controlling the relative phase comprises a phase shifter connected between said power splitter and one of said input terminals.

20. The circuit of claim 19 wherein:

said one of said input terminals is the input terminal of said anode slow-wave circuit.

21. The circuit of claim 17 wherein:

said output load has an impedance which is matched to the impedance of said first slow-wave circuit.

22. The circuit of claim 17 wherein:

said termination has an impedance which is matched to the impedance of said second slow-wave circuit.

23. The circuit of claim 17 wherein:

said means for providing a first portion and means for providing a second portion comprises means for controlling the relative amplitude of said first portion and said second portion of said output signal.

24. The low-noise crossed-field amplifier tube circuit of claim 17 wherein:

said first and second slow-wave circuits each have radially projecting vanes arranged to form at their proximate ends a cylindrical electron interaction space; and the vane-to-vane phase dispersion of each of said first and second slow-wave circuits being substantially equal to thereby effectively couple to the electrons in the interaction space to form electron spokes.

25. The amplifier circuit of claim 17 wherein:

said first and second slow-wave circuits have phase dispersion characteristics which are substantially matched at at least an operating frequency of said tube.

26. The amplifier circuit of claim 23 wherein:

said phase dispersion characteristics are substantially matched over a band of frequencies.

27. The amplifier circuit of claim 17 wherein:

said first and second slow-wave circuits have substantially the same phase shift per pitch over the operating frequency range of said amplifier circuit.

28. The amplifier circuit of claim 17 wherein:

said first and second slow-wave circuits have substantially the same mode number over the operating frequency band of the crossed-field amplifier tube circuit.

29. The amplifier circuit of claim 17 wherein:

the total phase shift from input to output terminal of each of said first and second slow-wave circuits, respectively, is substantially the same at at least one frequency in the operating band of said tube.

30. The circuit of claim 17 wherein:

said output load has an impedance matched to the impedance of said first slow-wave circuit.

31. The tube of claim 17 wherein:

said termination is an impedance matched to the output impedance of said second slow-wave circuit.

32. The tube of claim 17 wherein said cathode slow-wave circuit comprises spaced electron emissive surfaces each forming individual spaced cathodes.

33. The tube of claim 17 wherein said cathode slow-wave circuit comprises spaced bars, said bars having an electron emissive substance coating forming a cathode on each said coated bar.

34. The tube of claim 33 wherein said bars are circumferentially spaced and longitudinally extending.

35. An amplifier tube comprising:

a first and second slow-wave circuit in said tube;

means for applying a first and second input signal to said first and second slow-wave circuits, respectively;

said first and second slow-wave circuits being coupled to each other;

one of said first and second slow-wave circuits having an output adapted to be connected to a load; and means for providing electrons in said tube thereby providing said coupling of said first and second slow-wave circuits.

36. The tube of claim 35 comprising in addition:

the other of said first and second slow-wave circuits having an output adapted to connect to a termination.

37. The tube of claim 35 wherein:

said means for providing provides a cloud of electrons between said first and second slow-wave circuits.

38. The tube of claim 35 wherein:

said first and second slow-wave circuits have substantially equal phase dispersion along the length of each of said slow-wave circuits.

39. The tube of claim 35 wherein:

said first and second slow-wave circuits have comparable phase dispersion along the length of each said slow-wave circuits sufficient to produce an output signal in said load having a high signal-to-noise ratio.

40. The tube of claim 39 wherein:

said first and second slow-wave circuits have a predetermined phase difference at corresponding portions along the length of each of said slow-wave circuits.

41. The tube of claim 35 wherein:

said first and second slow-wave circuits are low electron-coupling-impedance circuits thereby allowing the high signal-to-noise ratio to be obtained over a broad bandwidth.

42. A low-noise crossed-field amplifier tube circuit comprising:

a tube comprising:

an anode comprising a first slow-wave circuit having a first input terminal and a first output terminal;

a cathode;

an interaction space between said anode and cathode;

said cathode comprising a second slow-wave circuit having a second input terminal and a second output terminal, said cathode providing electrons to the interaction space between said cathode and said anode;

said first and second slow-wave circuits being coupled through said interaction space;

means for providing an input signal to the input terminal of said anode first slow-wave circuit thereby coupling a portion of said input signal to said second slow-wave circuit through said interaction space;

an output load connected to the output terminal of said anode first slow-wave circuit; and a first and second impedance termination connected to the input and output terminals, respectively, of said cathode second slow-wave circuit.

43. The low-noise crossed-field amplifier tube circuit of claim 42 wherein:

said first and second slow-wave circuits each have radially projecting vanes arranged to form at their proximate ends a cylindrical electron interaction space; and the vane-to-vane phase dispersion of each of said first and second slow-wave circuits being substantially equal to thereby effectively couple to the electrons in the interaction space to from electron spokes.

44. The amplifier of claim 42 wherein:

said first and second slow-wave circuits have phase dispersion characteristics which are substantially matched over a broad band of frequencies.

45. The amplifier circuit of claim 42 wherein:

said first and second slow-wave circuits have substantially the same phase shift per pitch over the operating frequency range of said amplifier circuit.

46. The amplifier circuit of claim 42 wherein:

said first and second slow-wave circuits have substantially the same mode number over the operating frequency band of the crossed-field amplifier tube circuit.

47. The amplifier circuit of claim 46 wherein:

said first and second slow-wave circuits have phase dispersion characteristics which are substantially matched over a band of frequencies.

48. The tube of claim 42 wherein said cathode slow-wave circuit comprises spaced bars, said bars having an electron emissive substance coating forming a cathode on each said coated bar.

49. The tube of claim 48 wherein said bars are circumferentially spaced and longitudinally extending.

50. The tube of claim 42 wherein said cathode slow-wave circuit comprises spaced electron emissive surfaces each forming individual spaced cathodes.

51. An amplifier tube comprising:

a first anode and second cathode slow-wave circuit in said tube;

means for applying a signal to said first slow-wave circuit;

said first and second slow-wave circuits being coupled to each other;

said first slow-wave circuit having an output adapted to be connected to a load;

the second slow-wave circuit being connected at its output to a termination; and means for providing electrons in said tube in an interaction region between said first and second slow-wave circuits.

52. The tube of claim 51 wherein:

said first and second slow-wave circuits have substantially equal phase dispersion along the length of each of said slow-wave circuits.

53. The tube of claim 51 wherein:

said first and second slow-wave circuits have comparable phase dispersion along the length of each said slow-wave circuits sufficient to produce an output signal in said load having a high signal-to-noise ratio.

54. The tube of claim 51 wherein said cathode slow-wave circuit comprises spaced electron emissive surfaces each forming individual spaced cathodes.

55. The tube of claim 51 wherein said cathode slow-wave circuit comprises spaced bars, said bars having an electron emissive substance coating forming a cathode on each said coated bar.

56. The tube of claim 55 wherein said bars are circumferentially spaced and longitudinally extending.

* * * * *